(12) United States Patent
Aramata

(10) Patent No.: US 8,766,727 B2
(45) Date of Patent: Jul. 1, 2014

(54) POWER AMPLIFICATION CIRCUIT

(71) Applicant: Murata Manufacturing Co., Ltd., Nagaokakyo (JP)

(72) Inventor: Tomohide Aramata, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 13/949,261

(22) Filed: Jul. 24, 2013

(65) Prior Publication Data

US 2013/0307629 A1 Nov. 21, 2013

Related U.S. Application Data

(63) Continuation of application No. PCT/JP2012/052092, filed on Jan. 31, 2012.

(30) Foreign Application Priority Data

Feb. 2, 2011 (JP) ................................. 2011-020964

(51) Int. Cl.
*H03F 3/193* (2006.01)
(52) U.S. Cl.
USPC .......................................... 330/306; 330/302
(58) Field of Classification Search
USPC .................... 330/302, 277, 306, 307
See application file for complete search history.

(56) References Cited

U.S. PATENT DOCUMENTS

| 5,969,582 A | * | 10/1999 | Boesch et al. ............... 333/129 |
| 6,281,762 B1 | | 8/2001 | Nakao et al. |
| 2007/0281629 A1 | | 12/2007 | Ahn et al. |

FOREIGN PATENT DOCUMENTS

| GB | 2 438 751 A | 12/2007 |
| JP | 05-299995 A | 11/1993 |
| JP | 10-247861 A | 9/1998 |
| JP | 2000-114950 A | 4/2000 |
| JP | 2006-121216 A | 5/2006 |
| JP | 2008-154201 A | 7/2008 |

OTHER PUBLICATIONS

Official Communication issued in International Patent Application No. PCT/JP2012/052092, mailed on Apr. 17, 2012.

* cited by examiner

*Primary Examiner* — Hieu Nguyen
(74) *Attorney, Agent, or Firm* — Keating & Bennett, LLP

(57) ABSTRACT

A power amplification circuit amplifies and then outputs transmission signals of a first frequency and a second frequency, which are different from each other. When the transmission signal of the first frequency is input, a first switch is turned ON, a first LC parallel resonant circuit enters a resonant state and the transmission signal is transmitted using a line containing a first capacitor as a main line. When the transmission signal of the second frequency is input, a second switch is turned ON, a second LC parallel resonant circuit enters a resonant state and the transmission signal is transmitted using a line containing a second capacitor as a main line. Therefore, a transmission signal does not pass through, using as a main line, a line into which a switch has been incorporated.

20 Claims, 3 Drawing Sheets

POWER AMPLIFICATION CIRCUIT

BACKGROUND OF THE INVENTION

1. Field of the Invention

The present invention relates to power amplification circuits preferably for use in power amplification modules that amplify signals of a plurality of frequency bands.

2. Description of the Related Art

In general, known wireless communication devices, such as cellular phones, are equipped with a transmission device for transmitting a plurality of transmission signals. A transmission device 102 described in Japanese Unexamined Patent Application Publication No. 2008-154201 and illustrated in FIG. 5 is used as such a transmission device of a multiband wireless communication device. A power amplification module 104 is used in the transmission device 102 and a power amplification circuit 110 of the power amplification module 104 has the following configuration.

The power amplification circuit 110 employs a power amplifier 109, a power detector 119, an isolator 121 and so forth for both first and second transmission signals and the two types of signal are separated by a switch 122 on the output side.

In such a power amplification circuit 110, the switch 122 is incorporated into a main line through which a transmission signal passes and as a result the following problems and issues arise. That is, power loss occurs in the switch 122, distortion occurs due to the large amount of power entering the switch 122 and the switch is required to have a high electrical power handling capability.

SUMMARY OF THE INVENTION

In light of such circumstances, preferred embodiments of the present invention provide a power amplification circuit in which power loss of a transmission signal and signal distortion due to an output-side switch and the electrical power handling capability of the switch are not issues.

A power amplification circuit according to a preferred embodiment of the present invention amplifies and outputs transmission signals of a first frequency and a second frequency, the first and the second frequency being different from each other. The power amplification circuit includes a power amplifier that amplifies the transmission signals of the first and second frequencies. A first LC parallel resonant circuit whose resonant frequency is set to the first frequency and that includes a switch, and a second LC parallel resonant circuit whose resonant frequency is set to the second frequency and that includes a switch, are connected in parallel with each other to an output side of the power amplifier. When the power amplifier operates with the transmission signal of the first frequency, the switch on the first LC parallel resonant circuit side enters an on state and the switch on the second LC parallel resonant circuit side enters an off state. When the power amplifier operates with the transmission signal of the second frequency, the switch on the first LC parallel resonant circuit side enters an off state and the switch on the second LC parallel resonant circuit side enters an on state.

With this power amplification circuit, a transmission signal does not pass through using, as a main line, a line along which a switch is arranged and therefore problems of power loss of a transmission signal caused by a switch and signal distortion caused by a large amount of power being input to a switch do not arise. In addition, there is no need for a switch to have a high electrical power handling capability.

Preferably, the first LC parallel resonant circuit and the second LC parallel resonant circuit share the same inductor. With this power amplification circuit, the number of wiring lines and inductors in the amplification circuit can be reduced.

In each of the LC parallel resonant circuits including a switch, the switch preferably is connected to the inductor. With this power amplification circuit, a signal does not pass through a switch or an inductor and therefore power loss can be prevented or significantly reduced.

With various preferred embodiments of the present invention, power loss of a transmission signal and signal distortion in a switch in a power amplification circuit is significantly reduced.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
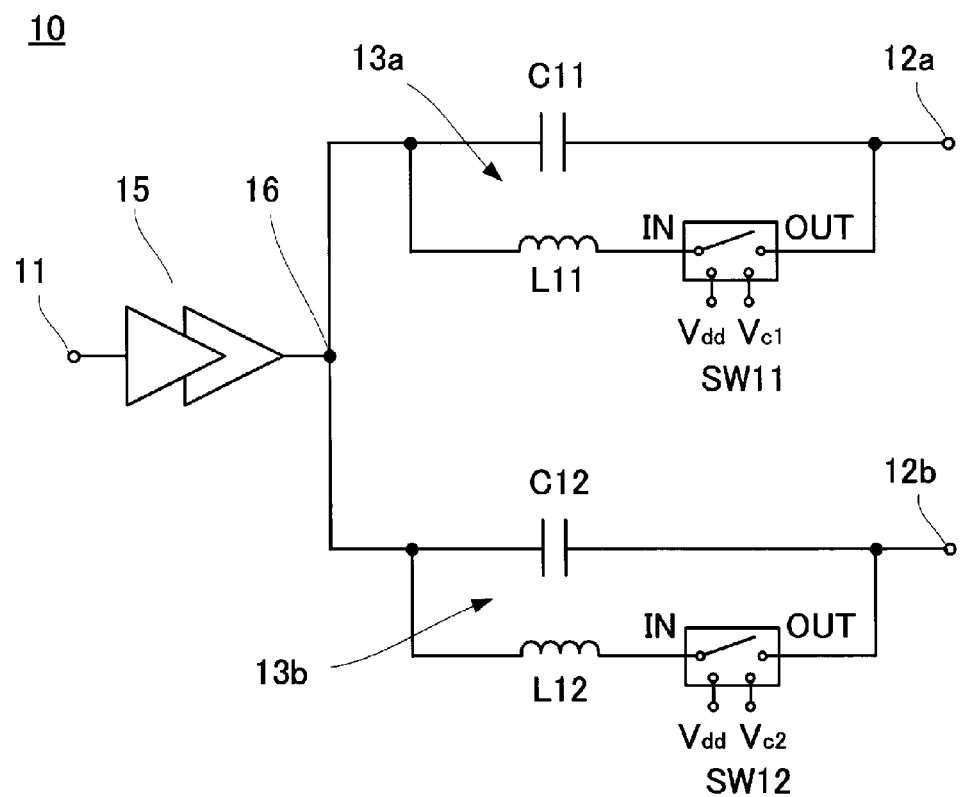
FIG. 1 is a circuit diagram of a power amplification circuit according to Preferred Embodiment 1 of the present invention.

Hereafter, power amplification circuits according to preferred embodiments of the present invention will be described in detail while referring to the drawings.

Preferred Embodiment 1

FIG. 1 is a circuit diagram of a power amplification circuit 10 of the present preferred embodiment.

The power amplification circuit 10 of the present preferred embodiment, as illustrated in FIG. 1, includes a power amplifier 15, capacitors C11 and C12, inductors L11 and L12 and switches SW11 and SW12. The switches SW11 and SW12 each include an input terminal IN and an output terminal OUT for a transmission signal and an input terminal Vdd for a driving voltage signal and respectively include input terminals Vc1 and Vc2, which are used for input of a control signal.

The capacitor C11 and the inductor L11, along with the switch SW11, define an LC parallel resonant circuit 13a, the switch SW11 being connected in series with the inductor L11. Similarly, an LC parallel resonant circuit 13b is defined by the capacitor C12, the inductor L12 and the switch SW12.

The power amplifier 15 and the LC parallel resonant circuits 13a and 13b are connected to each other via a branching point 16.

Regarding predetermined frequencies of signals that are used by the power amplification circuit 10, for example, there are a transmission signal of a first frequency of 824 MHz to 849 MHz (transmission signal of US cellular scheme) and a transmission signal of a second frequency of 898 MHz to 925

MHz (transmission signal of J-CDMA scheme). The resonant frequency of the LC parallel resonant circuit 13a is set to the first frequency, which is the frequency of a transmission signal blocked by the LC parallel resonant circuit 13a, and the resonant frequency of the LC parallel resonant circuit 13b is set to the second frequency, which is the frequency of a transmission signal blocked by the LC parallel resonant circuit 13b.

Next, operation of the power amplification circuit 10 will be described.

When a transmission signal of the first frequency is input from the input terminal 11, for example, a positive voltage control signal is input to the control signal input terminal Vc1 of the switch SW11 and the switch SW11 enters a conductive state (ON). Then, the LC parallel resonant circuit 13a enters a resonant state and the first frequency transmission signal passes through using the line containing the capacitor C12 as a main line and is output to the output terminal 12b, without being able to pass through the LC parallel resonant circuit 13a. Similarly, when a transmission signal of the second frequency is input from the input terminal 11, for example, a positive voltage control signal is input to the control signal input terminal Vc2 of the switch SW12 and the switch SW12 enters a conductive state (ON). Then, the LC parallel resonant circuit 13b enters a resonant state and the second frequency transmission signal passes through using the line containing the capacitor C11 as a main line and is output to the output terminal 12a, without being able to pass through the LC parallel resonant circuit 13b. That is, the first frequency transmission signal is separated to the output terminal 12b and the second frequency transmission signal is separated to the output terminal 12a by the power amplification circuit 10.

With the above-described circuit configuration, the first and second frequency transmission signals are not able to pass through using lines along which the switches SW11 and SW12 are arranged as main lines and therefore power loss of a transmission signal due to a switch is significantly reduced and occurrence of signal distortion due input of a large amount of power to a switch is prevented. In addition, there is no need for the switches to have high power handling capabilities and therefore cost reduction is possible.

Next, an example structure of a circuit module including the power amplification circuit of the present preferred embodiment will be described.

Figure 2A:
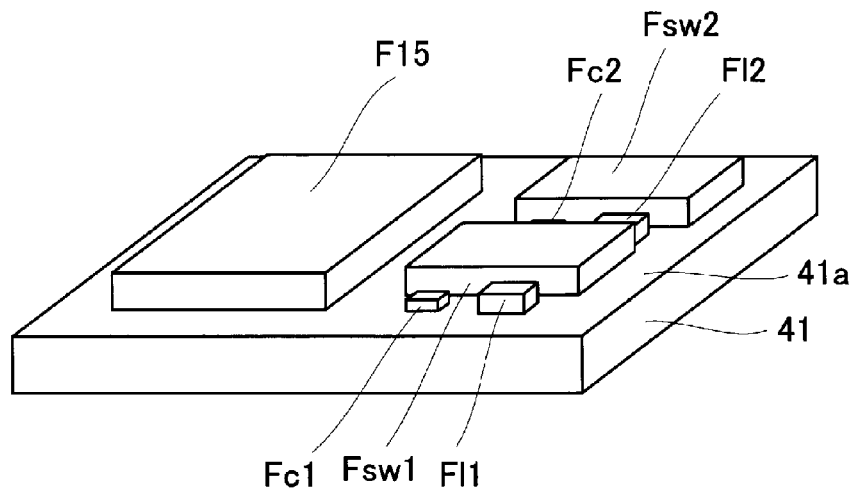
FIGS. 2A and 2B are structural diagrams of a circuit module that includes the power amplification circuit according to Preferred Embodiment 1 of the present invention.
Figure 2B:
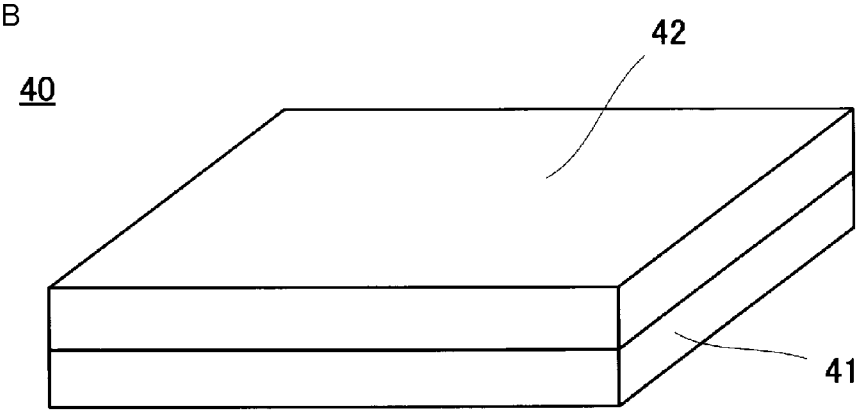

FIG. 2A is an external perspective view of a circuit board 41 preferably composed of, for example, a ceramic or a glass epoxy resin and a circuit module formed preferably by mounting elements such as capacitors, inductors, switches and a power amplifier with solder on one main surface 41a of the circuit board 41. FIG. 2B is an external perspective view of a circuit module 40 in a state in which the above-mentioned elements have been sealed by an insulating resin 42.

The correspondence between the mounted elements of FIG. 2A and the elements of the power amplification circuit 10 of FIG. 1 is as follows. The capacitors C11 and C12 correspond to Fc1 and Fc2, the inductors L11 and L12 correspond to F11 and F12, the switches SW11 and SW12 correspond to Fsw1 and Fsw2 and the power amplifier 15 corresponds to F15. In addition, although not illustrated, the elements are connected to each other through wiring electrodes located on the circuit board 41 and a large number of connection terminals that are enable connection to another board are located on the circuit board 41.

The above-described example structure is not limiting and a structure in which the circuit board is defined by a multilayer board, in which passive elements and so forth are built into the multilayer board and that achieves size reduction, profile reduction and cost reduction is also possible.

Preferred Embodiment 2

Figure 3:
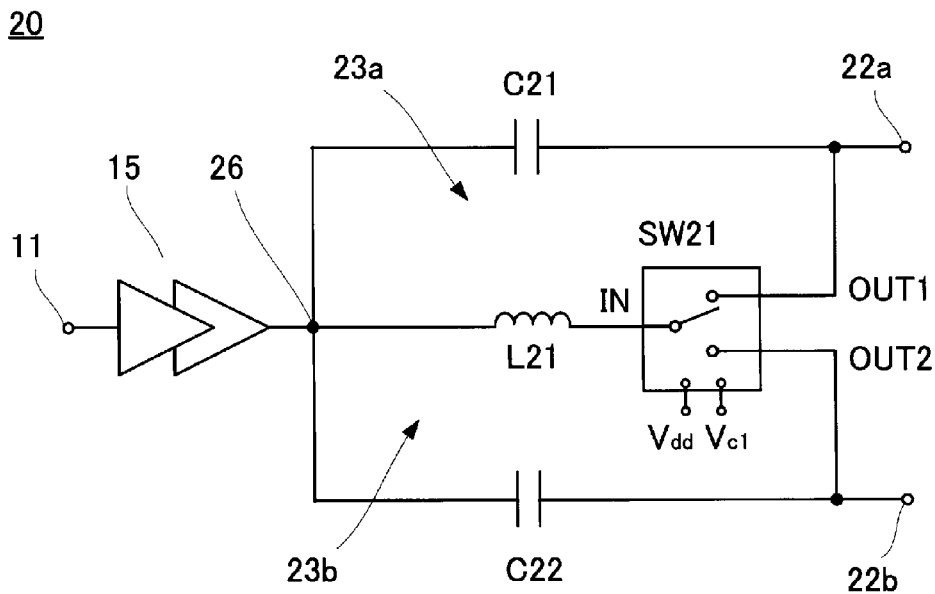
FIG. 3 is a circuit diagram of a power amplification circuit according to Preferred Embodiment 2 of the present invention.

FIG. 3 is a circuit diagram of a power amplification circuit 20 of the present preferred embodiment. In the present preferred embodiment, constituent elements that are the same as those in the above-described Preferred Embodiment 1 will be denoted by the same symbols and description thereof will be omitted.

The power amplification circuit 20, as illustrated in FIG. 3, includes a power amplifier 15, capacitors C21 and C22, an inductor L21 and a switch SW21. The switch SW21 is called a single pole double throw (SPDT) type switch and includes two switching terminals (OUT1 and OUT2) for one common terminal (IN).

The capacitor C21 and the inductor L21, along with the switch SW21, define an LC parallel resonant circuit 23a, the switch SW21 being connected in series with the inductor L21. An LC parallel resonant circuit 23b is similarly defined by the capacitor C22, the inductor L21 and the switch SW21. The power amplifier 15 and the LC parallel resonant circuits 23a and 23b are connected to each other via a branching point 26.

The resonant frequency of the LC parallel resonant circuit 23a is set to the first frequency, which is the frequency of a transmission signal blocked by the LC parallel resonant frequency circuit 23a and the resonant frequency of the LC parallel resonant circuit 23b is set to the second frequency, which is the frequency of a transmission signal blocked by the LC parallel resonant frequency circuit 23b.

When a transmission signal of the first frequency is input from the input terminal 11, for example, a positive voltage control signal is input to a control signal input terminal Vc1 of the switch SW21 and the switch SW21 switches the LC parallel resonant circuit 23a side ON and switches the LC parallel resonant circuit 23b side OFF. Then, the LC parallel resonant circuit 23a enters a resonant state and the first frequency transmission signal passes through using the line containing the capacitor C22 as a main line and is output to the output terminal 22b, without being able to pass through the LC parallel resonant circuit 23a side. Similarly, when a transmission signal of the second frequency is input from the input terminal 11, for example, a negative voltage control signal is input to the control signal input terminal Vc1 of the switch SW21 and the switch SW21 switches the LC parallel resonant circuit 23a side OFF and switches the LC parallel resonant circuit 23b side ON. Then, the LC parallel resonant circuit 23b enters a resonant state and the second frequency transmission signal passes through using the line containing the capacitor C21 as a main line and is output to the output terminal 22a, without being able to pass through the LC parallel resonant circuit 23b side. That is, the first frequency transmission signal is separated to the output terminal 22b and the second frequency transmission signal is separated to the output terminal 22a by the power amplification circuit 20.

With the above-described circuit configuration, in addition to the effect obtained in Preferred Embodiment 1, the number of inductors and switches can be reduced and the size and cost of the circuit module can be reduced.

Figure 4:
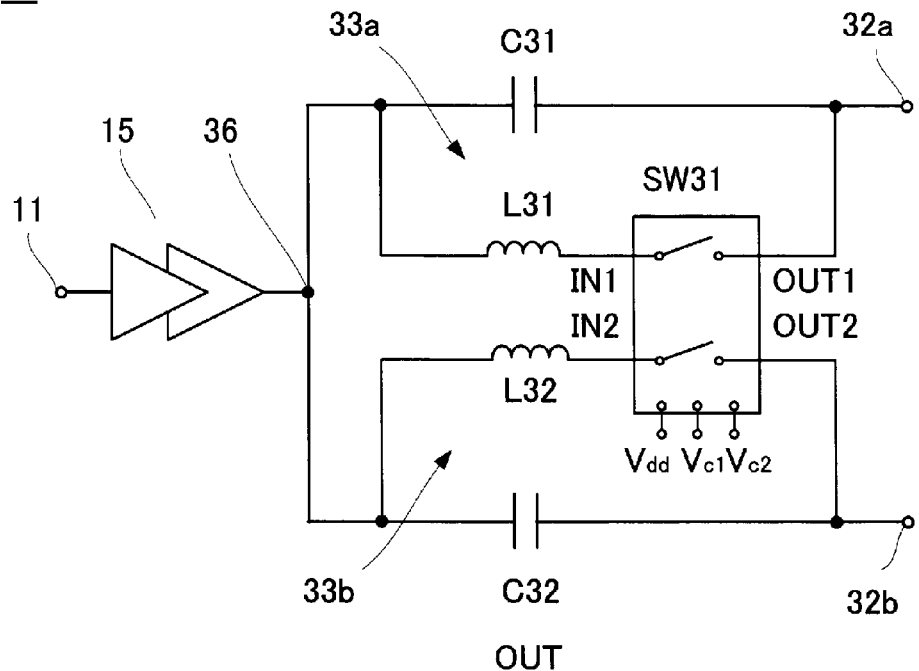
FIG. 4 is a circuit diagram of a power amplification circuit according to a modification of Preferred Embodiment 2 of the present invention.
Figure 5:
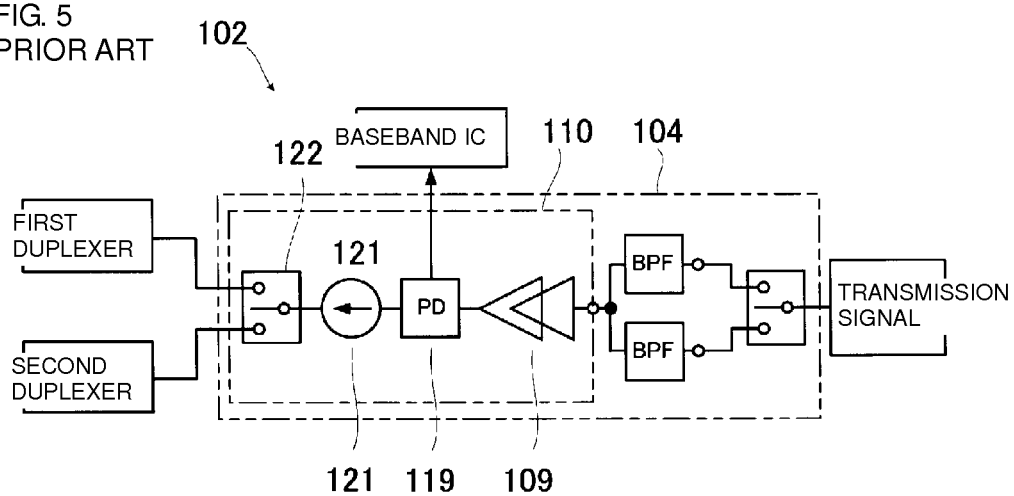
FIG. 5 is a circuit diagram of a power amplification circuit of the related art.

FIG. 4 is a circuit diagram of a power amplification circuit 30 according to a modification of Preferred Embodiment 2.

The power amplification circuit 30, as illustrated in FIG. 4, includes a power amplifier 15, capacitors C31 and C32, inductors L31 and L32 and a switch SW31. The switch SW31 is called a double pole double throw (DPDT) type switch and includes two common terminals (IN1 and IN2) and two switching terminals (OUT1 and OUT2).

The capacitor C31 and the inductor L31, along with the switch SW31, define an LC parallel resonant circuit 33a, the switch SW31 being connected in series with the inductor L31. An LC parallel resonant circuit 33b is similarly defined by the capacitor C32, the inductor L32 and the switch SW31. The power amplifier 15 and the LC parallel resonant circuits 33a and 33b are connected to each other via a branching point 36.

The resonant frequency of the LC parallel resonant circuit 33a is set to the first frequency, which is the frequency of a transmission signal blocked by the LC parallel resonant frequency circuit 33a, and the resonant frequency of the LC parallel resonant circuit 33b is set to the second frequency, which is the frequency of a transmission signal blocked by the LC parallel resonant frequency circuit 33b.

When a transmission signal of the first frequency is input from the input terminal 11, for example, a positive voltage control signal is input to the control signal input terminal Vc1 of the switch SW31 and a zero voltage control signal is input to the control signal input terminal Vc2 of the switch SW31, the switch SW31 switches the LC parallel resonant circuit 33a side ON and switches the LC parallel resonant circuit 33b OFF side. Then, the LC parallel resonant circuit 33a enters a resonant state and the first frequency transmission signal passes through using the line containing the capacitor C32 as a main line and is output to the output terminal 32b, without being able to pass through the LC parallel resonant circuit 33a side. Similarly, when a transmission signal of the second frequency is input from the input terminal 11, for example, a zero voltage control signal is input to the control signal input terminal Vc1 of the switch SW31 and a positive voltage is input to the control signal input terminal Vc2 of the switch SW31 and the switch SW31 switches the LC parallel resonant circuit 33a side OFF and switches the LC parallel resonant circuit 33b side ON. Then, the LC parallel resonant circuit 33b enters a resonant state and the second frequency transmission signal passes through using the line containing the capacitor C31 as a main line and is output to the output terminal 32a, without being able to pass through the LC parallel resonant circuit 33b side. That is, the first frequency transmission signal is separated to the output terminal 32b and the second frequency transmission signal is separated to the output terminal 32a by the power amplification circuit 30.

With the above-described circuit configuration, in addition to the advantageous effects obtained in Preferred Embodiment 1, the number of switches can be reduced and the size and cost of the circuit module can be reduced.

The present invention is not limited to the circuits described in the above preferred embodiments. The above-described circuits are basic configurations and can be changed to a circuit configuration including, for example, elements such as a power detector and an isolator as in the power amplification circuit 110 described in the background art.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:
1. A power amplification circuit that amplifies and then outputs transmission signals of a first frequency and a second frequency, the first frequency and the second frequency being different from each other, the power amplification circuit comprising:

a power amplifier that amplifies the transmission signals of the first and second frequencies;
a first LC parallel resonant circuit having a resonant frequency equal to the first frequency and including a switch, an inductor and a capacitor; and
a second LC parallel resonant circuit having a resonant frequency equal to the second frequency and including a switch, an inductor and a capacitor; wherein
the switch of the first LC parallel resonant circuit is connected in parallel with the capacitor of the first LC parallel resonant circuit;
the switch of the second LC parallel resonant circuit is connected in parallel with the capacitor of the second LC parallel resonant circuit;
the first and second LC parallel resonant circuits are connected in parallel with each other to an output side of the power amplifier;
when the power amplifier operates with the transmission signal of the first frequency, the switch of the first LC parallel resonant circuit enters an on state and the switch of the second LC parallel resonant circuit enters an off state; and
when the power amplifier operates with the transmission signal of the second frequency, the switch of the first LC parallel resonant circuit enters an off state and the switch of the second LC parallel resonant circuit enters an on state.

2. The power amplification circuit according to claim 1, wherein the inductor of the first LC parallel resonant circuit and the inductor of the second LC parallel resonant circuit is the same inductor.

3. The power amplification circuit according to claim 1, wherein, in each of the first and second LC parallel resonant circuits, the switch is connected to the inductor.

4. The power amplification circuit according to claim 1, wherein the first frequency is in a range of 824 MHz to 849 MHz and the second frequency is in a range of 898 MHz to 925 MHz.

5. The power amplification circuit according to claim 1, wherein when the switch of the first LC parallel resonant circuit enters the on state, the first LC parallel resonant circuit enters a resonant state and the first frequency transmission signal passes through a line containing the capacitor of the second LC parallel resonant circuit as a main line and is output to an output terminal without passing through the first LC parallel resonant circuit.

6. The power amplification circuit according to claim 1, wherein when the switch of the second LC parallel resonant circuit enters the on state, the second LC parallel resonant circuit enters a resonant state and the second frequency transmission signal passes through a line containing the capacitor of the first LC parallel resonant circuit as a main line and is output to an output terminal without passing through the second LC parallel resonant circuit.

7. The power amplification circuit according to claim 1, further comprising a circuit board including the power amplifier, the first LC parallel resonant circuit and the second LC parallel resonant circuit mounted on a surface thereof.

8. The power amplification circuit according to claim 7, wherein the circuit board is made of a ceramic or a glass epoxy resin.

9. The power amplification circuit according to claim 7, further comprising an insulating resin arranged on the surface of the circuit board to seal the power amplifier, the first LC parallel resonant circuit and the second LC parallel resonant circuit.

10. The power amplification circuit according to claim 1, further comprising a multilayer board including therein the power amplifier, the first LC parallel resonant circuit and the second parallel resonant circuit.

11. The power amplification circuit according to claim 1, wherein the switch of the first LC parallel resonant circuit is a single pole double throw switch including two switching terminals for one common terminal.

12. The power amplification circuit according to claim 1, wherein the switch and the inductor of the first LC parallel resonant circuit is the same as the switch and the inductor of the second parallel resonant circuit.

13. The power amplification circuit according to claim 12, wherein the switch and the inductor are connected in series to each other.

14. A power amplification circuit that amplifies and then outputs transmission signals of a first frequency and a second frequency, the first frequency and the second frequency being different from each other, the power amplification circuit comprising:
   a power amplifier that amplifies the transmission signals of the first and second frequencies;
   a first LC parallel resonant circuit having a resonant frequency equal to the first frequency and including a switch, an inductor and a capacitor; and
   a second LC parallel resonant circuit having a resonant frequency equal to the second frequency and including a switch, an inductor and a capacitor; wherein
   the switch of the first LC parallel resonant circuit is connected in parallel with the capacitor of the first LC parallel resonant circuit;
   the switch of the second LC parallel resonant circuit is connected in parallel with the capacitor of the second LC parallel resonant circuit;
   the first and second LC parallel resonant circuits are connected in parallel with each other to an output side of the power amplifier;
   when the switch of the first LC parallel resonant circuit enters the on state, the first LC parallel resonant circuit enters a resonant state and the first frequency transmission signal passes through a line containing the capacitor of the second LC parallel resonant circuit as a main line and is output to an output terminal without passing through the first LC parallel resonant circuit; and
   when the switch of the second LC parallel resonant circuit enters the on state, the second LC parallel resonant circuit enters a resonant state and the second frequency transmission signal passes through a line containing the capacitor of the first LC parallel resonant circuit as a main line and is output to an output terminal without passing through the second LC parallel resonant circuit.

15. The power amplification circuit according to claim 14, wherein the inductor of the first LC parallel resonant circuit and the inductor of the second LC parallel resonant circuit is the same inductor.

16. The power amplification circuit according to claim 14, wherein, in each of the first and second LC parallel resonant circuits, the switch is connected to the inductor.

17. The power amplification circuit according to claim 14, wherein the first frequency is 824 MHz to 849 MHz and the second frequency is 898 MHz to 925 MHz.

18. The power amplification circuit according to claim 14, wherein the switch of the first LC parallel resonant circuit is a single pole double throw switch including two switching terminals for one common terminal.

19. The power amplification circuit according to claim 14, wherein the switch and the inductor of the first LC parallel resonant circuit is the same as the switch and the inductor of the second parallel resonant circuit.

20. The power amplification circuit according to claim 19, wherein the switch and the inductor are connected in series to each other.

* * * * *